(12) United States Patent
Shiao

(10) Patent No.: US 6,214,713 B1
(45) Date of Patent: Apr. 10, 2001

(54) TWO STEP CAP NITRIDE DEPOSITION FOR FORMING GATE ELECTRODES

(75) Inventor: J. S. Shiao, Hsinchu (TW)

(73) Assignees: ProMOS Technology, Inc.; Mosel Vitelic Inc, both of Hsinchu (TW); Siemens AG, Munich (DE)

( * ) Notice: Subject to any disclaimer, the term of this patent is extended or adjusted under 35 U.S.C. 154(b) by 0 days.

(21) Appl. No.: 09/175,869

(22) Filed: Oct. 19, 1998

(51) Int. Cl.[7] .................. H01L 21/31; H01L 21/461; H01L 21/469; H01L 23/405; H01L 23/58
(52) U.S. Cl. .................. 438/592; 438/624; 438/649; 438/655; 438/656; 438/669; 438/680; 438/682; 438/683; 438/737; 438/738; 438/744; 438/755; 438/757; 438/761; 438/763; 438/791; 438/902; 257/632; 257/635; 257/640; 257/649; 257/750; 257/754; 257/757; 257/760; 257/768; 257/770
(58) Field of Search .................. 438/592, 655, 438/656, 648, 649

(56) References Cited

U.S. PATENT DOCUMENTS

| 4,470,189 | * | 9/1984 | Roberts et al. | 29/571 |
| 5,668,065 | * | 9/1997 | Lin | 438/303 |
| 5,742,088 | * | 4/1998 | Pan et al. | 257/382 |
| 5,756,401 | * | 5/1998 | Iizuka | 438/719 |
| 5,821,594 | * | 10/1998 | Kasai | 257/410 |
| 5,897,350 | * | 4/1999 | Lee et al. | 438/238 |
| 5,923,988 | * | 7/1999 | Cheng et al. | 438/305 |
| 5,966,602 | * | 10/1999 | Kawazu et al. | 438/258 |

OTHER PUBLICATIONS

R.F. Bunshah, "Handbook of Deposition Technologies for Films and Coatings", 2nd. edition, Noyes Publications, Park Ridge, NJ, USA, 1994, p. 452, 1994.*

* cited by examiner

Primary Examiner—Olik Chaudhuri
Assistant Examiner—Bernard E. Souw
(74) Attorney, Agent, or Firm—W. Wayne Liauh

(57) ABSTRACT

A method for forming the gate electrode in an integrated circuit, in which a cap silicon nitride layer is deposited in a two step process to improve the condition of silicon nitride residue remaining on the surface of tungsten silicide. First, a layer of polysilicon and a layer of tungsten silicide are sequentially formed on the semiconductor substrate, subsequently, a thin film of silicon nitride is formed at a first temperature and a second silicon nitride is formed at a second temperature, then the pattern of the contact window of gate is defined and the first etching is performed to remove the second and the second silicon nitride, finally, the second etching is performed to remove the layers of polysilicon and tungsten silicide to form a gate electrode.

10 Claims, 3 Drawing Sheets

TWO STEP CAP NITRIDE DEPOSITION FOR FORMING GATE ELECTRODES

BACKGROUND OF THE INVETNION

1. Field of the Invention

This invention relates to a method for forming gate electrodes in integrated circuits and, more particularly, to a method for forming a gate electrode by a two-step deposition of a cap silicon nitride.

2. Description of the Prior Art

The packing density of the number of circuits on a semiconductor chip has been greatly enhanced along with reducing the size of the device and increasing the integration density. This has resulted in a tremendous improvement in the electrical property of the devices and in lowering of the manufacturing cost.

However, some problems have arisen with the continued reduction in the size of the devices. These problems arise because of, for example, the natural limit of the manufacturing process and the electrical properties of the devices. One of the process limitations is the inability to control the precision of the lithography. Another is the necessary repetition of processing steps when etching a thick isolation layer to open the contact window which is part of interconnect since a certain distance to gate must be maintained. This problem in etching control becomes much more serious in the manufacturing process of multi-layered polysilicon. Therefore, the process of self-aligned contact (SAC) has been developed to decrease the area of the contact window.

The technology of self-aligned contact has been applied on the source-drain contact of metal-oxide-semiconductor (MOS) in ultra large scale integrated circuits. The gate of the metal-oxide-semiconductor comprises, in general, the layers of metal, oxide and semiconductor. But due to the poor adhesion ability of most kinds of metals to silicon dioxide which is used as the oxide layer, polysilicon which posses excellent adhesive ability to silicon dioxide and compatibility with the process is widely used in place of metal in MOS. However, the resistively of polysilicon is still too high to be a conductor even after doping. Therefore, metal silicide which as better conductivity is incorporated with the polysilicon. This new metal layer comprising polysilicon and metal silicide provides excellent electrical characteristics for MOS operation. This metal layer including polysilicon and metal silicide is called polysilicon, among which the most popular material is tungsten silicide ($Wsi_x$).

A conventional process to form the contact window of a source/drain is shown in FIG. 1. A polysilicon layer 20 and a tungsten silicide layer 30 are sequentially formed on the semiconductor substrate 10. Then a layer of silicon nitride ($Si_3N_4$) is applied as a cap dielectric 40 and another layer of silicon nitride which is subsequently formed as sidewall spacers function together as isolation between source/drain and gate in a so-called self-aligned contact (SAC) process, in which the thickness of sidewall spacers ranges from 300 to 800 angstroms. The typical way to form silicon nitride is by low pressure chemical vapor deposition (LPCVD) at the temperature around 780 degrees C, for example, see U.S. Pat. No. 4,660,276 to Hsu of RCA (the entire disclosure of which is herein incorporated by reference). However, the phase transition of tungsten silicide will spontaneously take place at such a high temperature, so that undesirable effects including recrystallization of tungsten silicide and a rough interface between silicon nitride and tungsten silicide are unavoidably a result of this process. Meanwhile, the practices of silicon nitride will fall into the cracks and voids between the tungsten silicon grain boundaries, causing defects in the device.

In the following description some steps conventional steps are excluded to form the gate pattern. Lithography and etching are previously used to form a contact window, after the gate pattern on the silicon nitride is defined, the first etching 100 is performed to remove silicon nitride which was not covered by a photoresist pattern (not shown). The photoresist is then removed, and the second SAC etching 200 is performed to remove the silicide and polysilicon layers which are covered by the patterned silicon nitride, as shown in FIG. 2.

Worst of all, because silicon nitride which has already generated into the cracks and voids of the interface between silicon nitride and the tungsten silicide, cannot be totally cleared up during the first etching; silicon nitride residue 41 will be induced on the interface. Due to a large difference of etching selectivity between silicon nitride and tungsten silicide (about 1:4) during the second etching, the shape of the remaining silicon nitride residue 41 will further transfer to tungsten silicide and polysilicon, thus undesired polysilicon residue 21 will also be left over on the substrate.

The present invention relates to a method for forming a gate in which the silicon nitride residue on the interface is avoided. This reduces the problems associated with etching tungsten silicon and polysilicon due to the presence of silicon nitride residue as discussed above.

SUMMARY OF THE INVENTION

It is therefore the main object of this invention to avoid leaving residual silicon nitride on the surface of tungsten silicide by two-step deposition of silicon nitride.

It is another object of this invention to improve the rough interface between silicon nitride and tungsten silicide by forming silicon nitride by a low temperature process which prevents the penetration of silicon nitride into the voids and cracks due to high temperature prior art process.

The above mentioned objects are achieved by the following steps. All first, a semiconductor substrate is provided with polysilicon and tungsten silicon formed sequentially thereon; then a first silicon nitride with a first thickness is formed at a first temperature, and a second silicon nitride with a second thickness is formed at a second temperature, in which the first temperature is lower than the second temperature. Next, the first etching is performing after defining the gate pattern to remove both the first and the second silicon nitride. Then, the second etching is performed to remove the polysilicon and tungsten silicide to obtain the gate structure according to the present invention.

DETAILED DESCRIPTION OF THE EMBODIMENT

A method for making gate electrodes in integrated circuits is provided by the present invention in which a MOS transistor with a polycide structure is described in the following embodiment as a nonlimitative example to display this method in detail.

Figure 1:
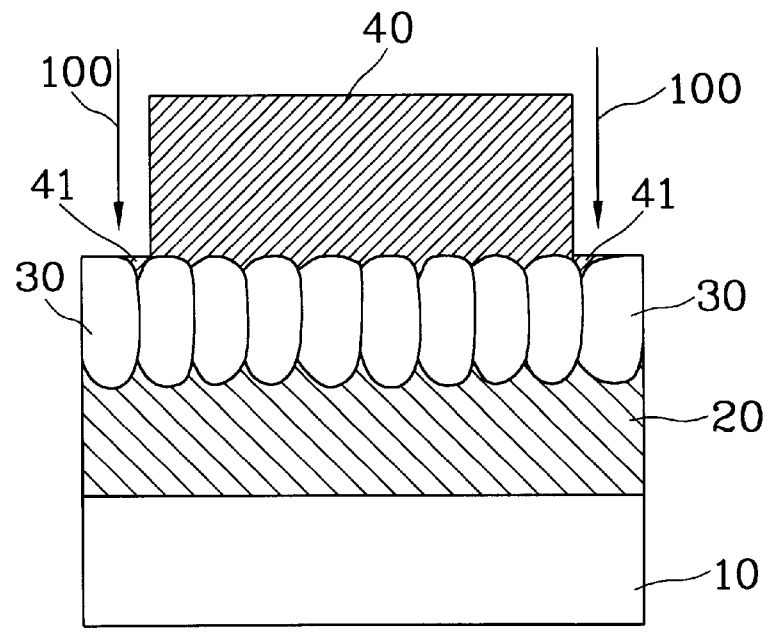
FIG. 1 is a cross-section view of the silicon nitride residue remaining on the interface of tungsten silicide and silicon nitride after the first etching according to the prior art.
Figure 2:
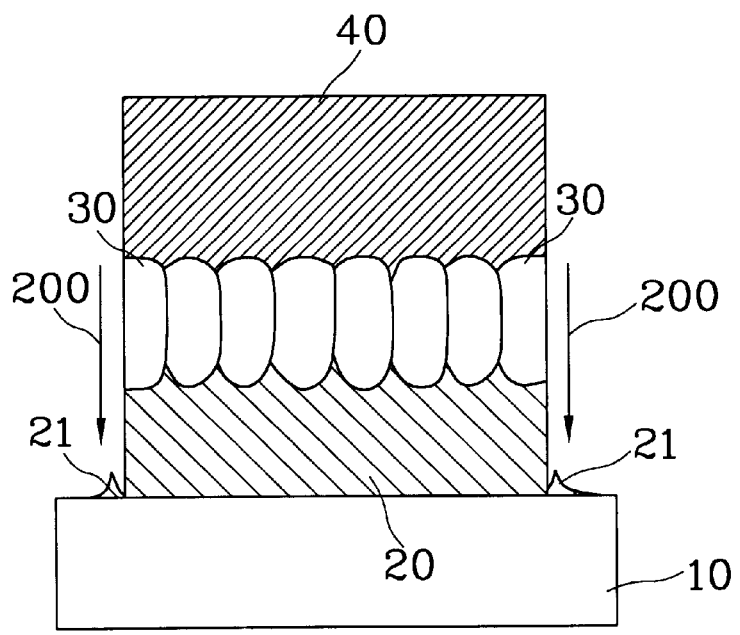
FIG. 2 is a cross-section view of the polysilicon residue remaining on the semiconductor substrate after the second etching according to the prior art.
Figure 3:
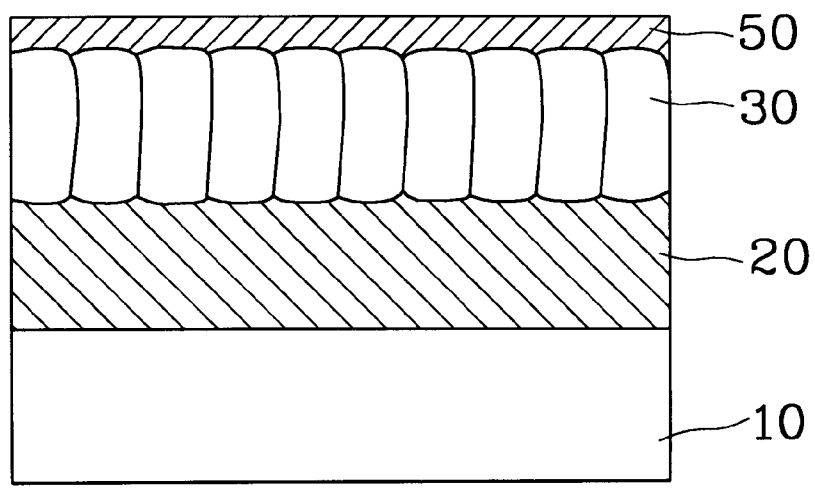
FIG. 3 is a cross-section view of forming the first silicon nitride in accordance with the process of the present invention.

As illustrated in FIG. 3, first, a polysilicon layer 20 and a tungsten silicide layer 30 are formed sequentially on a semiconductor substrate 10. This is followed by the critical step of the process. Silicon nitride 50 is formed by the plasma enhanced chemical vapor deposition (PECVD), in which the deposition temperature is ranging from 300 degrees C to 500 degrees C and the thickness of the first silicon nitride layer is between 100 angstroms to 1000 angstroms. The advantage of this PECVD nitride layer 50 is its lower processing temperature, therefore, the first silicon nitride 50 is formed at a temperature below its underlaying tungsten silicide phase transition temperature. As a result, serious tungsten silicide 30 film crack or void problems in the prior art can be eliminated, and a smoother interface is thus obtained.

Figure 4:
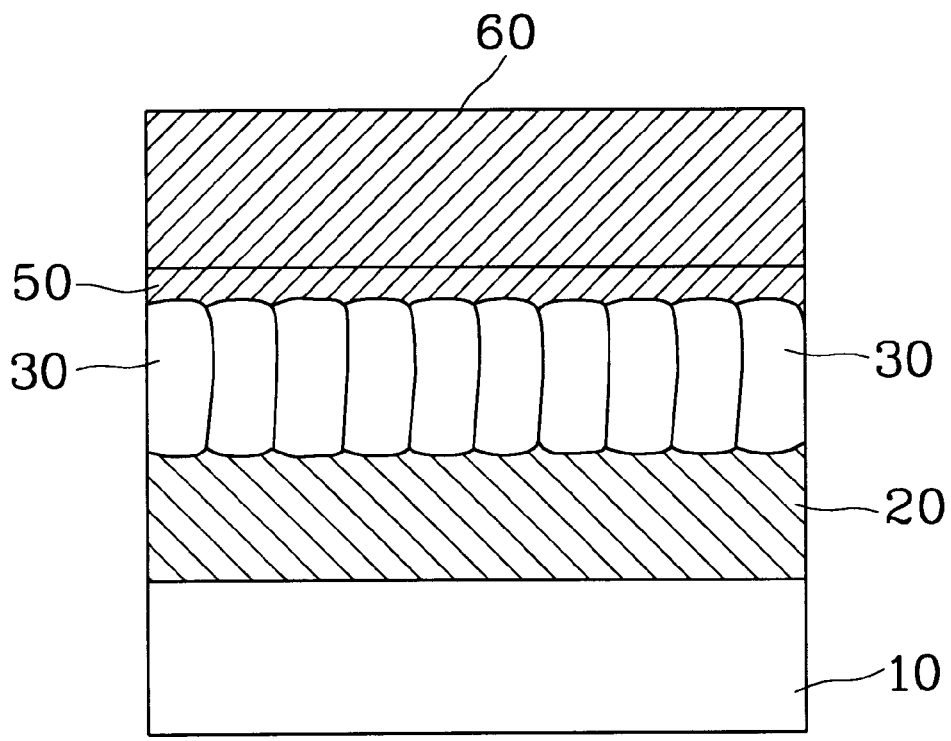
FIG. 4 is a cross-section view of forming the second silicon nitride in accordance with the process of the present invention.

Then as shown in FIG. 4, at a higher processing temperature, a second silicon nitride layer 60 with a thicker thickness is formed by low pressure chemical vapor deposition (LPCVD), in which the temperature is in the range of between 710 degrees C and 850 degrees C to obtain a thickness of about between 2000 angstroms to 3500 angstroms. Although tungsten silicide 30 will undergo phase transition in such a high temperature process, the covering of the first silicon nitride acts as a seal on the interface, the deposited second silicon nitride particles are prevented from falling into the rough polycide grain boundary interfaces as happened in the prior art. Therefore, the previously described problem of non-uniform etching due to the presence of silicon nitride left-over in the following steps can be effectively headed off.

Figure 5:
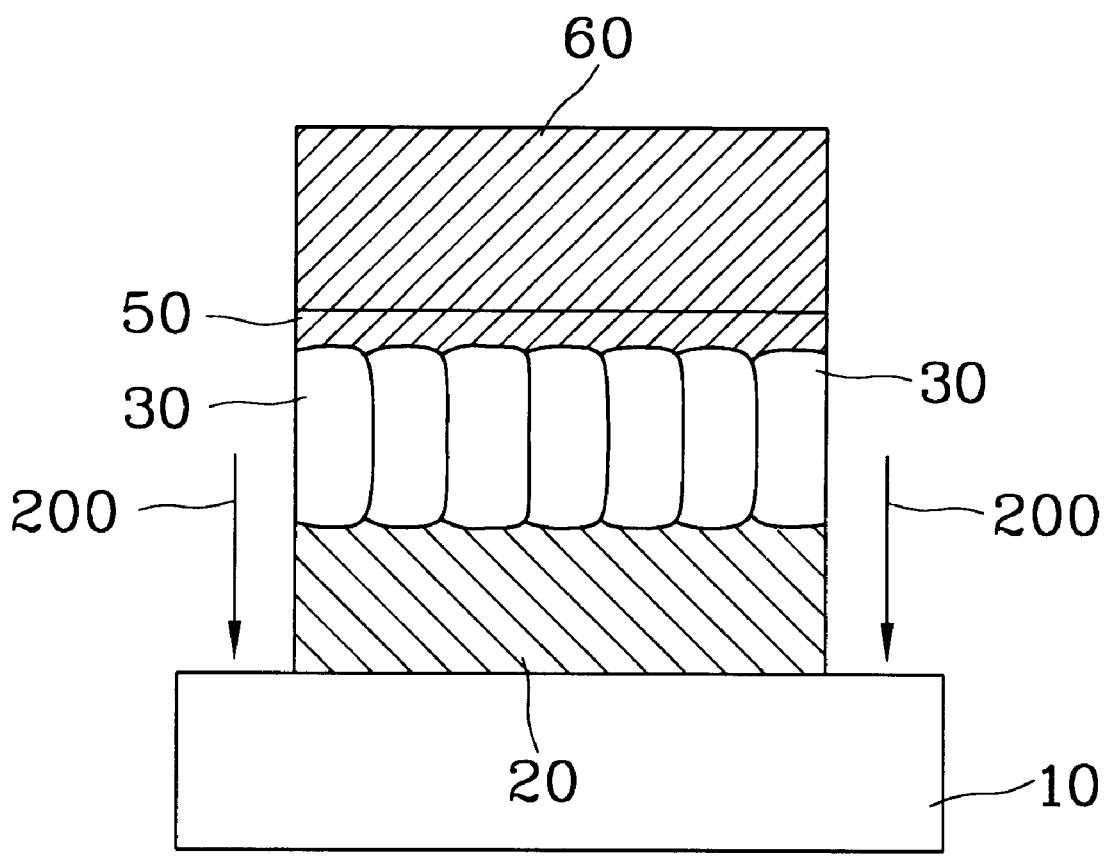
FIG. 5 is a cross-section view of the gate structure defined after the second etching according to the present invention.

Referring now to FIG. 5, the following describes the etching steps for defining a gate electrode pattern. At first, a conventional method is used to define a photoresist pattern of gate over the layer of the second silicon nitride. Then, the first etching is performed to remove the first and the second silicon nitride layers which are uncovered by the photoresist pattern. After removing the photoresist, the patterned silicon nitride is taken as a mask to perform second etching 200 as shown in FIG. 5 to remove the tungsten silicide and polysilicon which are uncovered by silicon nitride. Thus a gate electrode without the concern of shorting according to the present invention is accomplished.

The method for forming a gate described in this invention has the following advantages:

1. A thin film of silicon nitride is firstly formed at a lower temperature and the second silicon nitride is thereafter formed at a higher temperature to improve tungsten silicide surface interface and thus the numbers of cracks and voids on the surface of tungsten silicide can also be effectively decreased.

2. The conventional problems caused by the remaining silicon nitride residue in the cracks and voids on the surface of silicon nitride after the silicon nitride has been etched is overcome, and the problem of non-uniform etching of the gate is therefore solved.

In this invention of two-step silicon nitride deposition, the key point is to add a step of low-temperature PECVD deposition of silicon nitride to produce a smoother interface between the silicon nitride and tungsten silicide. However, a low temperature process is also not used as a unique step to deposit silicon nitride in this invention, mainly because silicon nitride produced from low temperature process of PECVD has poorer uniformity as well as higher defect density. Therefore, due to the consideration of product yield, a thin film of silicon nitride produced by an additional step is offered in the present invention to, on one hand, keep the advantages of the prior art, and on the other hand, to overcome the conventional problems. It may thus be seen that the objects of the present invention set forth herein, as well as those made apparent from the foregoing description are effectively attained. While the preferred embodiment of the invention has been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method for forming a gate electrode, comprising the step of:
   (a) sequentially forming a polysilicon layer and a tungsten silicide layer on a semiconductor substrate;
   (b) forming a first silicon nitride layer with a first thickness at a first temperature overlaying said tungsten silicide layer, said first temperature being lower than a phase transition temperature of said tungsten silicide layer;
   (c) forming a second silicon nitride layer with a second thickness at a second temperature overlaying said first silicon nitride layer, said second temperature being higher than a phase transition temperature of said tungsten silicide layer;
   (d) defining a photoresist pattern of a gate electrode, and then performing a first etching to remove said first silicon nitride layer and said second silicon nitride layer that are not covered by said photoresist pattern; and
   (e) performing a second etching to remove said polysilicon layer and said tungsten silicide layer that are not covered by the remainder of said first and second silicon nitride layers;
   (f) wherein said first silicon nitride layer has a thickness between 100 angstroms and 1,000 angstroms, and said second silicon nitride layer has a thickness between 2,000 angstroms and 3,000 angstroms.

2. The method according to claim 1, wherein said first temperature is ranging from 300 degree C to 500 degree C.

3. The method according to claim 1, wherein said first thickness is between 100 angstroms to 1000 angstroms.

4. The method according to claim 1, wherein said second temperature is ranging from 710 degree C to 850 degrees C.

5. The method according to claim 1, wherein said second thickness is between 2000 angstroms to 3000 angstroms.

6. A method for defining a polycide pattern, comprising the steps of:
   (a) sequentially forming a polysilicon layer and a tungsten silicide layer on a semiconductor substrate;
   (b) forming a first silicon nitride layer with a first thickness at a first temperature overlaying said tungsten silicide layer, said first temperature being lower than a phase transition temperature of said tungsten silicide layer;
   (c) forming a second silicon nitride layer with a second thickness at a second temperature overlaying said first silicon nitride layer, said second temperature being higher than a phase transition temperature of said tungsten silicide layer;

(d) defining a photoresist pattern of a predetermined polycide structure, and then performing first etching to remove said first silicon nitride layer and said second silicon nitride layer that are not covered by said photoresist pattern; and (e) performing second etching to remove said polysilicon layer and said tungsten silicide layer that are not covered by the remainder of said first and second silicon nitride layers;

(f) wherein said first silicon nitride layer is formed by plasma-enhanced chemical vapor deposition (PECVD) process at a temperature ranging from 300 degrees C to 500 degrees C, and said second silicon nitride layer is formed by low-pressure chemical vapor deposition (LPCVD) process at a temperature ranging from 710 degrees C to 850 degrees C.

7. The method according to claim 6, wherein said first temperature is ranging from 300 degrees C to 500 degrees C.

8. The method according to claim 6, wherein said second temperature is ranging from 710 degrees C to 850 degrees C.

9. The method according to claim 6 wherein said first silicon nitride layer has a thickness between 100 angstroms and 1,000 angstroms, and said second silicon nitride layer has a thickness between 2,000 angstroms and 3,000 angstroms.

10. A method for forming a gate electrode, comprising the step of:

(a) sequentially forming a polysilicon layer and a tungsten silicide layer on a semiconductor substrate;

(b) forming a first silicon nitride layer with a first thickness at a first temperature overlaying said tungsten silicide layer, said first temperature being lower than a phase transition temperature of said tungsten silicide layer;

(c) forming a second silicon nitride layer with a second thickness at a second temperature overlaying said first silicon nitride layer, said second temperature being higher than a phase transition temperature of said tungsten silicide layer;

(d) defining a photoresist pattern of a gate electrode, and then performing a first etching to remove said first silicon nitride layer and said second silicon nitride layer that are not covered by said photoresist pattern; and (e) performing a second etching to remove said polysilicon layer and said tungsten silicide layer that are not covered by the remainder of said first and second silicon nitride layers;

(f) wherein said first silicon nitride layer has a thickness between 100 angstroms and 1,000 angstroms, and said second silicon nitride layer has a thickness between 2,000 angstroms and 3,000 angstroms;

(g) further wherein said first silicon nitride layer is formed by plasma-enhanced chemical vapor deposition (PECVD) process at a temperature ranging from 300 degrees C to 500 degrees C, and said second silicon nitride layer is formed by low-pressure chemical vapor deposition (LPCVD) process at a temperature ranging from 710 degrees C to 850 degrees C.

* * * * *